United States Patent [19]
Brunius

[11] Patent Number: 5,038,328
[45] Date of Patent: Aug. 6, 1991

[54] BAND PASS FILTER
[75] Inventor: Robert E. Brunius, St. Paul, Minn.
[73] Assignee: Interactive Technologies, Inc., St. Paul, Minn.
[21] Appl. No.: 544,850
[22] Filed: Jun. 27, 1990
[51] Int. Cl.[5] .......................... H04B 1/06; H04B 17/00
[52] U.S. Cl. ................................... 367/135; 367/901; 367/13; 367/136
[58] Field of Search ................. 367/135, 13, 136, 901; 330/107-109; 307/520; 340/506, 565, 566; 381/56

[56] References Cited
U.S. PATENT DOCUMENTS 3,643,173 2/1972 Whitten .............................. 330/107
4,855,713 8/1989 Brunius ............................... 340/506

OTHER PUBLICATIONS

Schilling et al., "Electronic Circuits", 1979, pp. 334-335.

Primary Examiner—Daniel T. Pihulic
Attorney, Agent, or Firm—D. L. Tschida

[57] ABSTRACT

An active, relatively high gain, low power consuming band pass filter circuit centered at approximately 6 KHZ and having a pass band of 100-200 HZ. In a disclosed glass breakage sensor, the filter couples sensed ambient sounds of breaking glass to associated detection, driver and annunciator means. Signals of appropriate duration and frequencies indicative of breaking glass are thereby monitorable to define and induce an alarm condition within a security system.

5 Claims, 6 Drawing Sheets

BAND PASS FILTER

BACKGROUND OF THE INVENTION

The present invention relates to security alarm systems and, in particular, to an improved, relatively high gain, band pass filter, which requires relatively low current and power and which finds application in a glass breakage sensor of a security alarm system.

A peculiar property of most window glasses, especially various materials used in pane glass, is that the glass upon striking a hard surface, such as when broken, demonstrates a relatively strong frequency component in a range centered at approximately 6 KHz. This characteristic facilitates the construction of security sensors or transducers which are capable of monitoring a related narrow band of frequencies for signals of sufficient duration. Alone or in combination with data from other system sensors, an alarm condition can thereby be ascertained for a secured premises.

In their most basic construction, and for a hard wired security system, a variety of conventional circuit components may be used to effect an appropriate sensor design. Typically, such sensors would include a transducer, band pass filter, detector and amplification means for driving a related annunicator. Such a sensor is typically also not designed to be power sensitive, due to the availability of relatively unlimited power from the system power supply.

For wireless, battery powered sensors, however, greater concern surrounds the passive power requirements of maintaining such a sensor in an operable condition for long periods of time. This is of special concern for glass breakage sensors requiring active, high gain filter circuits, such as that of the present invention.

SUMMARY OF THE INVENTION

It is accordingly a primary object of the present invention to provide an active, relatively high gain band pass filter circuit which is responsive to frequencies within a narrow pass band range centered at approximately 6 KHz.

It is a further object of the invention to provide a glass breakage sensor incorporating the improved filter circuit of the present invention into a wireless security system.

It is further object of the invention to provide an active filter circuit exhibiting relatively low passive power requirements.

Various of the foregoing objects, advantages and distinctions of the invention are particularly achieved in various bipolar configurations described below. Within the basic circuit configuration, a notch filter is feedback coupled with a transistor amplifier. A further improved construction provides for a gain controlled, emitter-follower construction. The latter circuit is, in turn, applied in hardwired and wireless security systems.

Still other objects, advantages and distinctions of the invention, as well as its detailed construction, will become more apparent hereinafter upon directing attention to the following description with respect to the appended drawings. Before referring thereto, it is to be appreciated the following description is made only by way of various presently considered embodiments and modifications thereto. The invention should accordingly not be interpreted in strict limitation to the described circuits, but rather should be interpreted within the spirit and scope of the following claims.

DESCRIPTION OF THE PREFERRED EMBODIMENT

Figure 1:
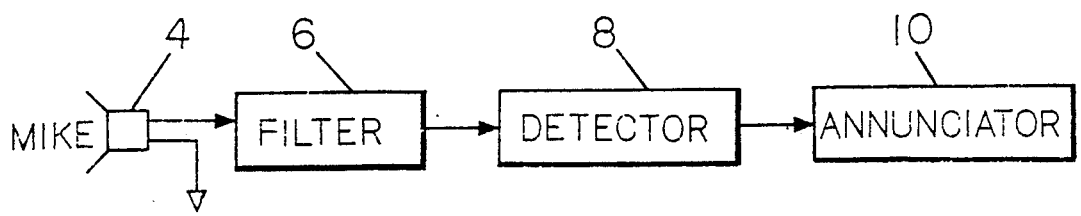
FIG. 1 shows a functional block diagram of a typical glass breakage sensor.

Referring to FIG. 1, a functional block diagram is shown of the primary circuit components of a glass breakage sensor, such as can be used within a security alarm system to detect the breaking of glass. Specifically, the sensor acoustically monitors a protected premises for emitted sounds of a predetermined duration and centered about a relatively narrow frequency band at 6 KHz. It is at this frequency that most glass resonates, when being broken or when the shattered pieces strike a hard surface.

A typical sensor of this type includes a microphone means 4 for sampling the acoustic energy of the ambient environment, which sampled signal is coupled to a band pass filter 6 centered at a 6 KHz frequency. Sounds outside of a narrow permitted range are thereby filtered from further consideration. A related detector 8 monitors the filtered sounds for signals of sufficient duration and amplitude and an associated annunciator 10 responds to events which exceed predetermined thresholds to notify a system controller (not shown) of the presence of an alarm.

Figure 4:
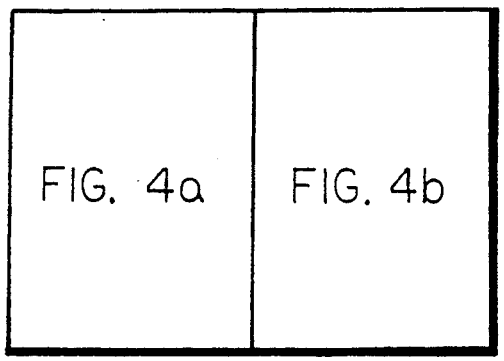
FIG. 4, comprised of FIGS. 4a and 4b, shows a schematic diagram of a complete glass breakage sensor including the filter of FIG. 3 which finds application within a hardwired security system having a bus architecture and which includes a gain control means.
Figure 5:
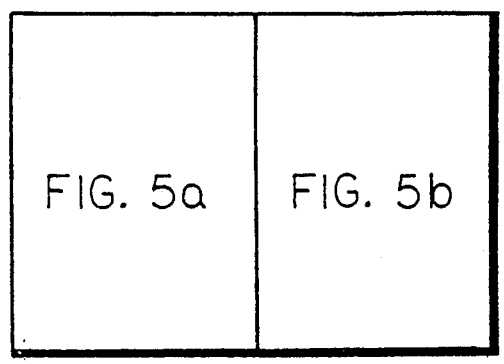
FIG. 5, comprised of FIGS. 5a and 5b, shows a schematic diagram of an improved sensor, like that of FIG. 4, coupled in a wireless system.

As will become more apparent with respect to FIGS. 4 and 5, the sensor can be coupled in a variety of system configurations. FIG. 4 particularly shows an implementation for a hard wired system having a bus architecture. FIG. 5 depicts a sensor which finds application in a wireless transmitter system, such as described in Applicant's U.S. Pat. No. 4,855,713 and copending application Ser. No. 156,547 now U.S. Pat. No. 4,951,029.

Although conventional sensor designs are usable in either system, conventional sensors are not particularly power conscious. This factor is of special concern in a wireless, battery powered system, such as in FIG. 5, which has limited available power. An effective circuit design for such an application should operate with a minimum current drain and especially when in a standby mode, if it is to conserve battery life. Such a circuit can then also be applied to a hardwired system.

One approach to designing a filter for such a sensor is to configure the sensor about an operational amplifier which includes a front end filter that is tuned to the frequency band of interest. Such filters, however, consume large amounts of power relative to battery operated equipment. Moreover, the switching rate of conventionally available operational amplifiers is not sufficiently fast for the frequencies of present interest. A further shortcoming of simple operational amplifier filters is that they have a relatively low Q of approximately 10, maximum. Although low power operational amplifiers do exist, they cannot slew fast enough for the present.

Figure 2:
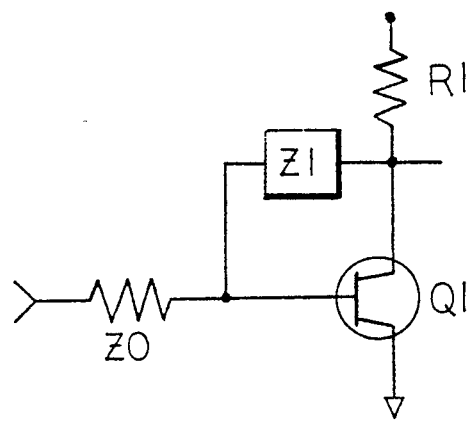
FIG. 2 shows a typical prior art design of an active band pass filter including an active, feedback coupled impedance component Z1.

Accordingly and with reference to FIG. 2, Applicant has conceived of an improved filter circuit which comprises a modified notch or narrow band reject filter element Z1, which is coupled to a bipolar emitter-follower amplifier configured about transistor Q1 and which provides the necessary inversion to create a pass band, as opposed to a band reject, filter.

Figure 3:
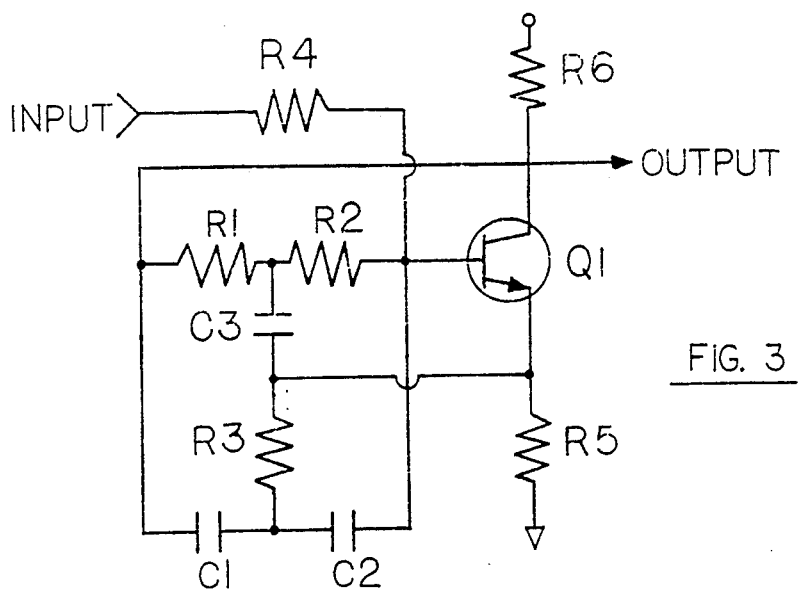
FIG. 3 shows the improved band pass filter of the present invention which comprises a notch filter coupled in combination with an emitter-follower coupled transistor amplifier.

Although the basic circuit of FIG. 2 provides the desirable frequency attributes, it is preferred that the circuit provide as large a gain as possible. FIG. 3 therefore shows a schematic diagram of an improved band pass filter of the type of FIG. 2, but wherein the notch filter portion Z1 is coupled between the base and emitter of the transistor Q1. This circuit has been found to exhibit the desired relatively high Q value, along with the desired frequency attributes. Specifically, the notch filter Z1 comprises a bridge circuit which includes a series coupled pair of resistors, R1 and R2 typically of equal magnitude, which are shunted in parallel to a pair of series coupled capacitors C1 and C2, which also are of equal magnitude. The junctions between the resistors R1, R2 and C1, C2 are coupled together via a series connected bridge capacitor C3 of one half the value of the capacitors C1 and C2 and a bridge resistor R3 of twice the magnitude of either of the resistors R1, R2. The collector of transistor Q1 is, in turn, coupled to the common junction of R1, C1 and the emitter is coupled to the junction between the serially connected bridge resistor R3 and capacitor C3. Base input resistor R4 and emitter resistor R5 and collector resistor R6 are used to appropriately bias the transmitter to conduct in the presence of the monitored frequency.

Figure 4A:
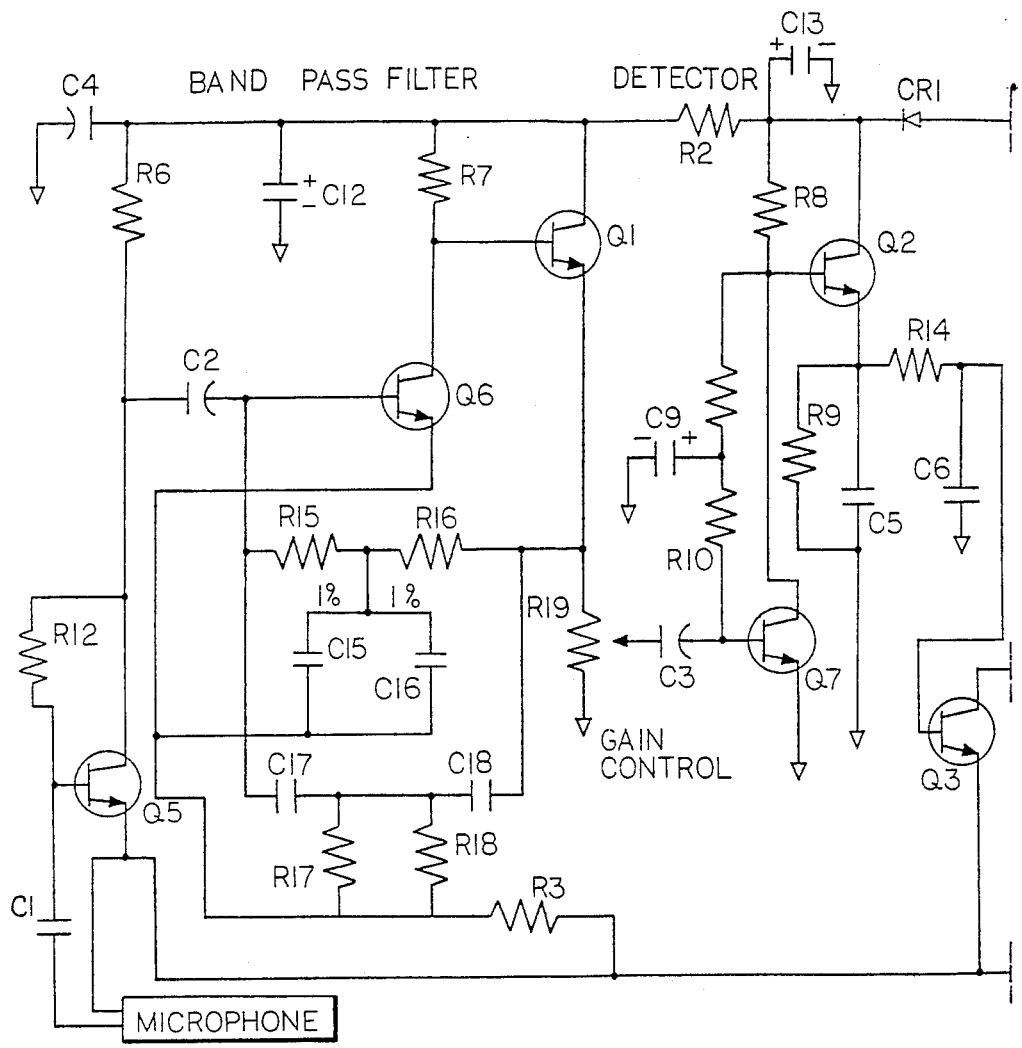
Figure 4B:
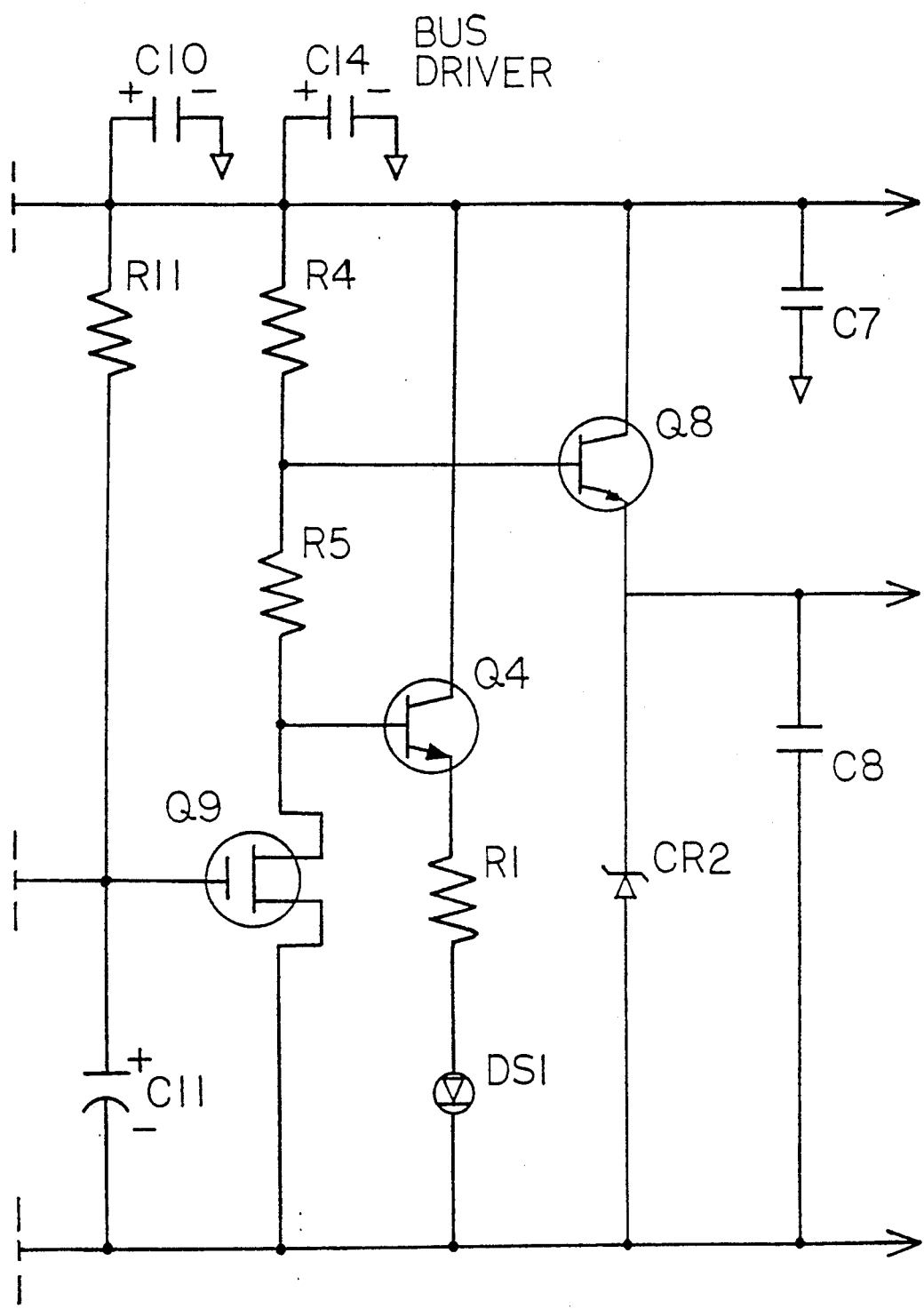
Figure 5A:
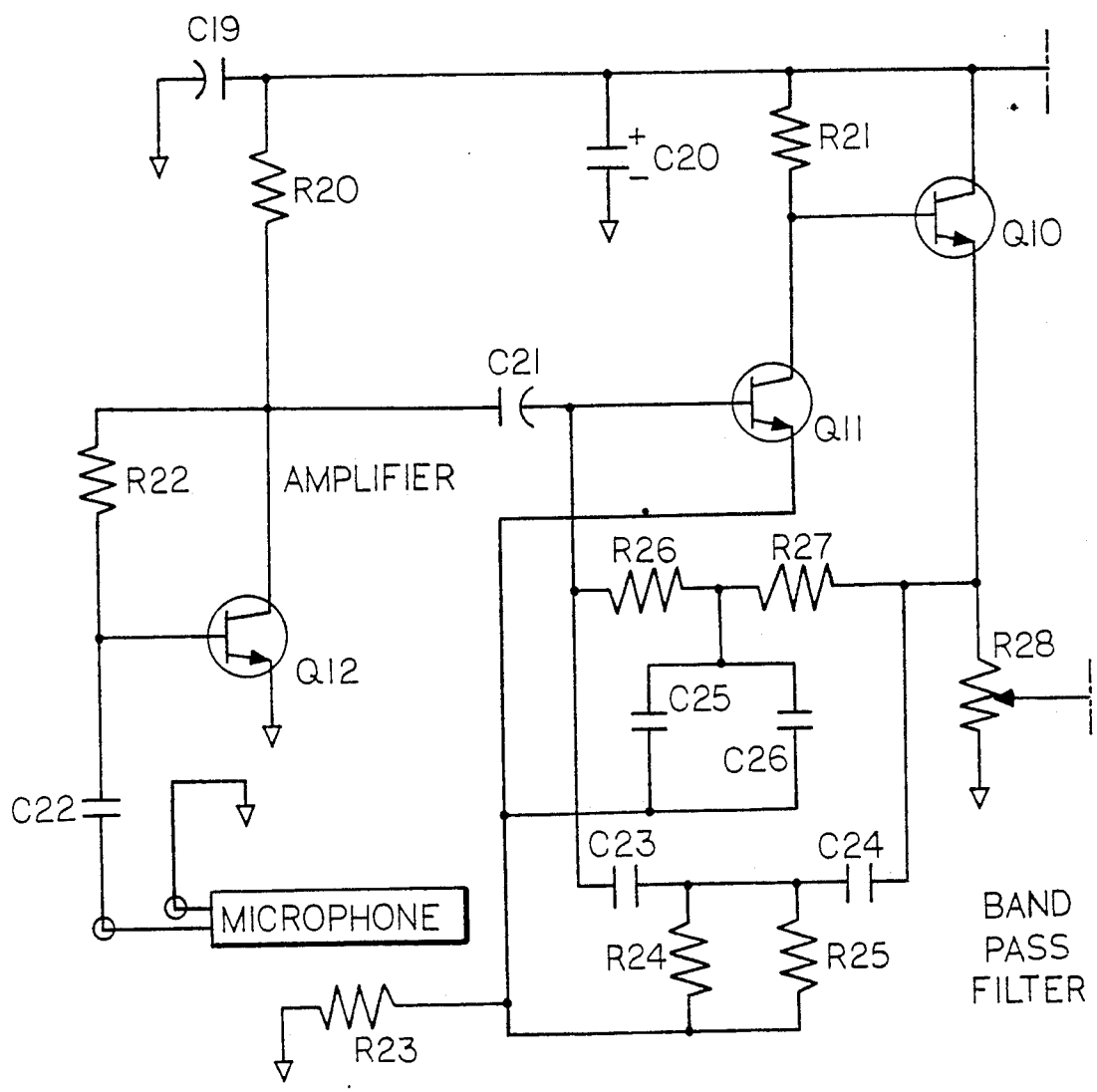
Figure 5B:
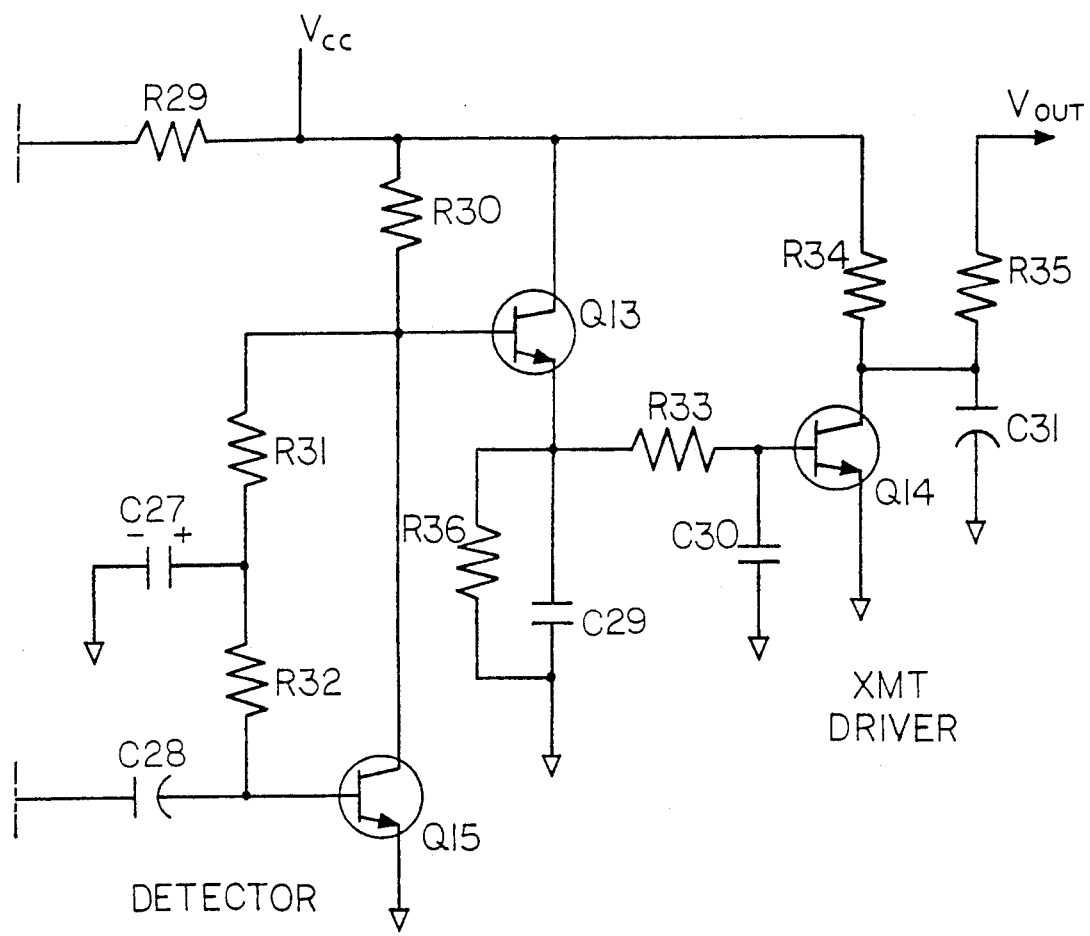

Turning attention to FIG. 4, comprised of FIGS. 4a and 4b, a further enhancement is shown of the circuit of FIG. 3 within a hardwired security system and wherein the output of the circuit, which is configured about transistor Q6, is coupled to a second, emitter-follower coupled transistor Q1 including resistors R7 and R8. The filter for this embodiment comprises shunt resistors R15, R16, shunt capacitors C17, C18, bridge capacitor pair C15, C16 and bridge resistor pair R7, R18. The resistance of emitter resistor R19 is further selectable in relation to the impendence of the filter circuitry to provide a gain control which permits the adjustment of the filter. The output of the filter is otherwise sampled by the detector circuitry at the potentiometer R19. Table I below shows the various component values for the circuit of FIG. 4.

TABLE 1

| COMPONENT | VALUES |
| --- | --- |
| R1 | 1K ohms |
| R2 | 10K ohms |
| R3 | 15K ohms |
| R4 | 100K ohms |
| R5, R19 | 200K ohms |
| R6, R7, R8, R9 | 1M ohms |
| R10, R11 | 2.7M ohms |
| R12, R13, R14 | 10M ohms |
| R15, R16, R17, R18 | 287K ohms |
| C1 | 47 pf |
| C2, C3 | 100 pf |
| C4 | .001 uf |

TABLE 1-continued

| COMPONENT | VALUES |
| --- | --- |
| C5, C6 | .01 uf |
| C7, C8 | .047 uf |
| C9, C10 | 1 uf |
| C11 | 2.2 uf |
| C12, C13 | 100 uf |
| C14 | 330 uf |
| C15, C16, C17, C18 | 100 pf |
| Q1, Q2, Q3, Q4 | MP5-A13 |
| Q5, Q6, Q7 | MP5-A18 |
| Q8 | PN4250A |
| Q9 | 2N7008 |

The detector portion of the circuit of FIG. 4, upon receipt of a frequency centered at 6 KHz monitors the output. If the signal persists for at a sufficient duration, the detector via transistors Q7, Q2 and Q3 produces a signal compatible with the bus driver which amplifies the output to a level compatible with the system controller circuitry (not shown) of the security system.

Alternatively and appreciating the intent to use the presently improved sensor in a wireless transmitter which transmits related radio frequency data indicative of a glass breakage alarm, FIG. 5 shows a system diagram of a sensor comparable to that of FIG. 4. The operation and organization of this sensor is essentially the same as described above. Table 2 shows the particular component values for the associated circuit components.

TABLE 2

| COMPONENT | VALUES |
| --- | --- |
| R2 | 10K ohms |
| R3 | 47K ohms |
| R4, R6, R7, R8 | 1M ohms |
| R5 | 510K ohms |
| R9 | 2.7M ohms |
| R10 | 22M ohms |
| R11, R12 | 10M ohms |
| R13, R14, R15, R16 | 287K ohms |
| R17 | 75 pf ohms |
| R22 | 250K ohms |
| R23 | 15K ohms |
| C8 | 56 pf |
| C9 | 100 pf |
| C16 | 47 pf |
| C17 | 300 pf |
| C18 | .001 uf |
| C19, C20 | .01 uf |
| C21 | 1 uf |
| C22 | 2.2 uf |
| C23 | 100 uf |
| C25, C26, C27 | 100 |
| C28 | 108 |
| Q1, Q2, Q3 | MP5-A13 |
| Q4 | MP5-A18 |
| Q5 | MP5-A18/A13 |
| Q6 | MP5-A18 |

Otherwise, the output of the sensor is coupled to a driver section which amplifies and couples the signal at predetermined levels to a sensor transmitter (not shown) which is of the type disclosed in Applicant's U.S. Pat. No. 4,855,713 required of the buss architecture for the associated security system.

From the foregoing, an improved acoustical sensor is shown which can be used to provide data pertaining to glass breakage to an associated security system controller, either via a direct or indirect wireless connection. Taken by itself or in combination with other point contact transducers mounted in the vicinity of the glass breakage sensor to detect intruders, the system is able to monitor a glass breakage condition and related unauthorized entry.

While the present invention has been described with respect to its presently preferred and various alternatively considered constructions, it is to be appreciated that still other constructions and modifications may suggest themselves to those of skill in the art without departing from the spirit and scope of the invention. Accordingly, it is contemplated that the following claims should be interpreted to include all those equivalent embodiments within the spirit and scope thereof.

What is claimed is:

1. Pass band filter apparatus comprising:
   (a) notch filter means for producing an output signal exhibiting a frequency response wherein a predetermined range of frequencies centered about a predetermined first frequency are rejected;
   (b) means for inverting the frequency response of said notch filter means and for amplifying the output signal; and
   (c) variable resistance means coupled to said notch filter means, a reference potential and means responsive to the amplified output signal for varying the signal gain of the amplifier means.

2. Apparatus as set forth in claim 1 wherein the inverting and amplifying means comprises a transistor having a base, emitter and collector junction and wherein said notch filter means includes an input port coupled to said collector junction and an output port coupled to said base junction.

3. Apparatus as set forth in claim 2 wherein said notch filter means comprises:
   (a) first and second resistive means serially coupled to one another and having first and second contacts thereto;
   (b) first and second capacitor means serially coupled to one another having a first and second contacts thereto;
   (c) third capacitor means having a first contact coupled to a junction between said first and second resistive means and a second contact coupled to a first contact of a third resistor, said third resistor having a second contact coupled to a junction between said first and second capacitor means; and
   (d) wherein said first contact of said first capacitor means and first resistor means are coupled to said collector junction and wherein said second contact of said second resistive means and said second capacitor means are coupled to said base and further including means coupling said emitter to the common junction between said third resistor and third capacitor.

4. Filter apparatus comprising:
   (a) first and second transistors, each having collector, base and emitter junctions;
   (b) filter means comprising;
      (i) first and second resistive means serially coupled to one another and having first and second contacts thereto;
      (ii) first and second capacitor means serially coupled to one another having a first and second contacts thereto;
      (iii) third capacitor means having a first contact coupled to a junction between said first and second resistive means and a second contact coupled to a first contact of a third resistor, said third resistor having a second contact coupled to a junction between said first and second capacitor means; and
      (iv) wherein said first contact of said first capacitor means and first resistor means are coupled to said collector junction and wherein said second contact of said second resistive means and said second capacitor means are coupled to said base and further including means coupling said emitter to the common junction between said third resistor and third capacitor.
   (c) wherein the first contact of said first resistive means and first capacitor means are coupled to the base of said first transistor, wherein the second contact of said third capacitor is coupled to the emitter of said first transistor, wherein the second contact of said second resistive means and capacitor means are coupled to the emitter of said second transistor and wherein the collector of said first transistor is coupled to the base of said second transistor.

5. Filter apparatus comprising:
   (a) means for acoustically monitoring ambient sounds;
   (b) notch filter means coupled to said acoustic means for producing an output signal exhibiting a frequency response wherein a predetermined range of frequencies centered about a predetermined first frequency are rejected;
   (c) means for inverting the frequency response of said notch filter means and for amplifying the output signal;
   (d) means for detecting an output of said filter; and
   (e) means for amplifying the output of said detection means.

* * * * *